United States Patent [19]
Wu

[11] Patent Number: 6,063,683
[45] Date of Patent: May 16, 2000

[54] METHOD OF FABRICATING A SELF-ALIGNED CROWN-SHAPED CAPACITOR FOR HIGH DENSITY DRAM CELLS

[75] Inventor: Shye-Lin Wu, Hsinchu, Taiwan

[73] Assignee: Acer Semiconductor Manufacturing, Inc., Hsinchu, Taiwan

[21] Appl. No.: 09/123,748

[22] Filed: Jul. 27, 1998

[51] Int. Cl.[7] .................................................. H01L 21/20
[52] U.S. Cl. ........................................... 438/397; 438/254
[58] Field of Search ..................................... 438/253, 254, 438/255, 256, 396, 397, 398, 399

[56] References Cited

U.S. PATENT DOCUMENTS

| | | | |
|---|---|---|---|
| 5,998,260 | 12/1999 | Lin | 438/254 |
| 6,004,857 | 12/1999 | Hslao et al. | 438/396 |

OTHER PUBLICATIONS

M. Sakao et al., A Capacitor–Over–Bit–Line (COB) Cell with a Hemispherical–Grain Storage Node for 64Mb DRAMs, 1990 IEEE, pp. 655–658.

H. Watanabe et al., A New Cylindrical Capacitor Using Hemispherical Grained Si (HSG–Si) for 256Mb DRAMs, 1992 IEEE, pp. 259–262.

*Primary Examiner*—David Nelms
*Assistant Examiner*—Dung A. Le
*Attorney, Agent, or Firm*—Harness, Dickey & Pierce, P.L.C.

[57] ABSTRACT

The method of the present invention for forming a capacitor on a semiconductor substrate includes the following steps. At first, a first oxide layer is formed over the substrate and a nitride layer is then formed over the oxide layer. A second oxide layer is formed over the nitride layer and a first silicon layer is formed over the second oxide layer. Next, a node opening is defined in the first silicon layer, the second oxide layer, and the nitride layer, upon the first oxide layer. Sidewall structures are then formed on sidewalls of the node opening. A contact opening is then defined in the first oxide layer under the node opening. The contact opening is defined in the first oxide layer under a region uncovered by the sidewall structures. The sidewall structures and a portion of the nitride layer nearby the node opening are removed to form undercut structures under the second oxide layer. A second silicon layer is then formed conformably over the contact opening, the undercut structures, the node opening, and the first silicon layer. A filling layer is formed over the second silicon layer. A planarizing is performed to planarize the substrate down to a surface of the second oxide layer. The filling layer and the second oxide layer are then removed. The nitride layer is also removed. A dielectric film is then formed conformably over the second silicon layer. Finally, a conductive layer is formed over the dielectric layer.

20 Claims, 6 Drawing Sheets

METHOD OF FABRICATING A SELF-ALIGNED CROWN-SHAPED CAPACITOR FOR HIGH DENSITY DRAM CELLS

FIELD OF THE INVENTION

The present invention relates to semiconductor manufacturing processes, and more specifically, to a method of fabricating a self-aligned crown-shaped capacitor for high density DRAM (dynamic random access memory) cells.

BACKGROUND OF THE INVENTION

In the electric industry, memory devices are of vital application in various kinds of computer, communication, and consumer electronic products. In the electric equipment, memory devices are employed for the storage and exchange of operating data and information. The information can be stored temporarily or permanently in various kinds of memory devices, depending on the system design and needs. The DRAM is one of the most important memory devices for providing temporary data storage in numerous system applications. In the last decade, the DRAM is the flagship product of the semiconductor industry for its high-density structure and wide applications.

In general, a DRAM cell is composed of a transistor and a capacitor. A MOSFET (metal oxide semiconductor field effect transistor) is utilized preferably to enable the writing and reading of data. The capacitor is employed to store an electric charge, wherein the data is represented by the voltage level of the electric charge. The DRAM cells can be accessed with unlimited reading and writing cycles with high frequency and reliability.

For reducing the cost and increasing the competitive power of the DRAM devices, the density of DRAM cells on a unit of chip area must be raised continuously. The number of DRAM cells on each chip has increased from 16M to 64M and it is believed that the 256M and higher volume DRAM chips will become the most competitive products before the end of the twentieth century. With the fast increasing density, the area occupied by each DRAM cell with a transistor and a capacitor has to narrow down several times while providing the same function and operation on data storage and exchange.

However, since the storage capacity of a capacitor is proportional to the surface area of the electrode, the capacitor structure of the traditional plate electrode must be improved. The capacitor structure must be redesigned to provide raised storage capacity or the capacitance under per unit chip area. In prior art designs, various types of stacked-capacitor structure had been proposed. As an example, M. Sakao et al. proposed a capacitor-over-bit-line (COB) cell structure in their work "A Capacitor-Over-Bit-Line (COB) Cell with a Hemispherical-Grain Storage Node for 64 Mb DRAMs" (in IEDM Tech. Dig., p. 655, 1990). It is disclosed that three-dimensional memory cells, such as stacked or trench capacitor cells, are necessary for future DRAMs in order to obtain sufficient storage capacitance in a small area. Several stacked capacitor cells have been proposed for 64Mb DRAMs, because, as compared to trench capacitor cells, their fabrication procedure is relatively simple and they offer higher immunity to soft error. In the stacked capacitor cell, large capacitance can be obtained by increasing storage node height, but this causes difficulties with optical delineation and patterning. Three dimensionally arranged storage node structures have been proposed. However, the attempts cause difficulties of fabrication procedure.

H. Wantanabe et al. disclosed a new cylindrical capacitor structure in their work "A New Cylindrical Capacitor Using Hemispherical Grained Si (HSG-Si) for 256 Mb DRAMs" (in IEDM Tech. Dig., p.259, 1992). A new selective etching technique using a low-pressure vapor hydrogen fluoride is developed to form the cylindrical capacitor electrode. A high selective etching (2000 times) of borophospho-silicate-glass to $SiO_2$ is realized with the technique. Disilane molecule irradiation in ultra-high vacuum chamber achieves the HSG-Si formation on the whole surface of phosphorous doped amorphous Si cylindrical electrode.

However, conventional stacked-capacitor structures have some unsolved strength problems in the fabrication of three-dimensional electrodes. In general, most of the three dimensional electrode structure are composed of several silicon layers which are deposited and defined separately. The three-dimensional structures with interfaces of several deposition processes on a single node are found to suffer from defect issues like cracks. The problem greatly damages the yield of the process. In addition, for developing future high density DRAMs, the conventional stacked-capacitor structure can not get sufficient capacitance. What is needed in the field is an improved design of a capacitor cell structure with raised storage capacitance without strength problem like the crack issue during manufacturing processes.

SUMMARY OF THE INVENTION

The present invention discloses a method of fabricating a storage cell as a capacitor. A self-aligned crown-shaped capacitor for high density DRAM cells can be formed without the crack issue of the prior art. One of the advantages of the method provided in the invention is that the storage cell can be formed with reduced processing steps.

The method of the present invention for forming a capacitor on a semiconductor substrate includes the following steps. At first, a first oxide layer is formed over the substrate and a nitride layer is then formed over the oxide layer. A second oxide layer is formed over the nitride layer and a first silicon layer is formed over the second oxide layer. Next, a node opening is defined in the first silicon layer, the second oxide layer, and the nitride layer, upon the first oxide layer. Sidewall structures are then formed on sidewalls of the node opening.

A contact opening is then defined in the first oxide layer under the node opening. The contact opening is defined in the first oxide layer under a region uncovered by the sidewall structures. The sidewall structures and a portion of the nitride layer nearby the node opening are removed to form undercut structures under the second oxide layer. A second silicon layer is then formed conformably over the contact opening, the undercut structures, the node opening, and the first silicon layer. A filling layer is formed over the second silicon layer. A planarizing is performed to planarize the substrate down to a surface of the second oxide layer. The filling layer and the second oxide layer are then removed. The nitride layer is also removed. A dielectric film is then formed conformably over the second silicon layer. Finally, a conductive layer is formed over the dielectric layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

A method of fabricating a crown-shaped capacitor is disclosed in the present invention. The self-aligned process in forming capacitor contact opening can be integrated into the semiconductor process of forming high-density DRAM cells. The capacitor structure formed by the proposed method can provide improved capacitance over a conventional stacked-capacitor structure. The number of masks used can also be reduced with the self-aligned process.

Figure 1:
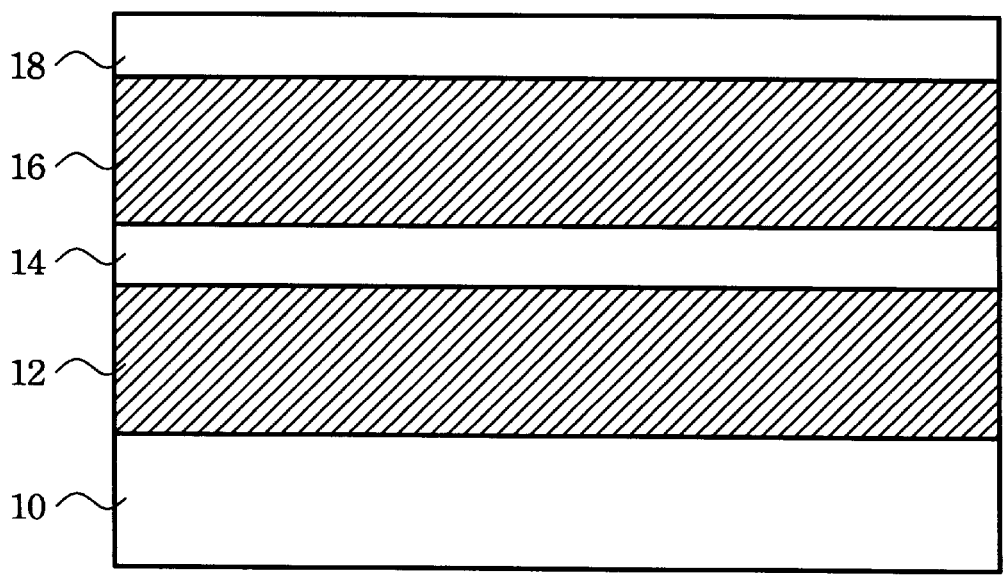
FIG. 1 illustrates a cross-sectional view of the step of forming a first oxide layer, a nitride layer, a second oxide layer, and a first silicon layer over a substrate in accordance with the present invention.

Referring to FIG. 1, a semiconductor substrate 10 is provided for forming capacitors over. In general, a substrate 10 with a preferably single crystalline silicon in a <100> direction is provided. For different applications or specifications, a substrate with different crystalline orientations or materials can be used alternatively. As an example, the substrate 10 is provided with transistors formed over in a DRAM fabricating processes. For a clear and focused illustration of the present invention, the transistors are not shown. In following figures, only a focused region of forming a single storage cell is presented and it is well known in the art to form numerous storage cells on a single wafer or substrate by a batch of semiconductor processes.

At first, a first oxide layer 12 is formed over the substrate 10. The first oxide layer 12 is formed preferably with a chemical vapor deposition (CVD) process. A nitride layer 14 is then formed over the oxide layer, also preferably by a chemical vapor deposition process. Followed with the nitride layer 14, a second oxide layer 16 is formed over and a chemical vapor deposition process can be employed in the case. Next, a first silicon layer 18 is formed over the second oxide layer 16. In the preferred embodiment, the first silicon layer can be a polysilicon layer. The polysilicon layer can be formed with well-known deposition processes.

Figure 2:
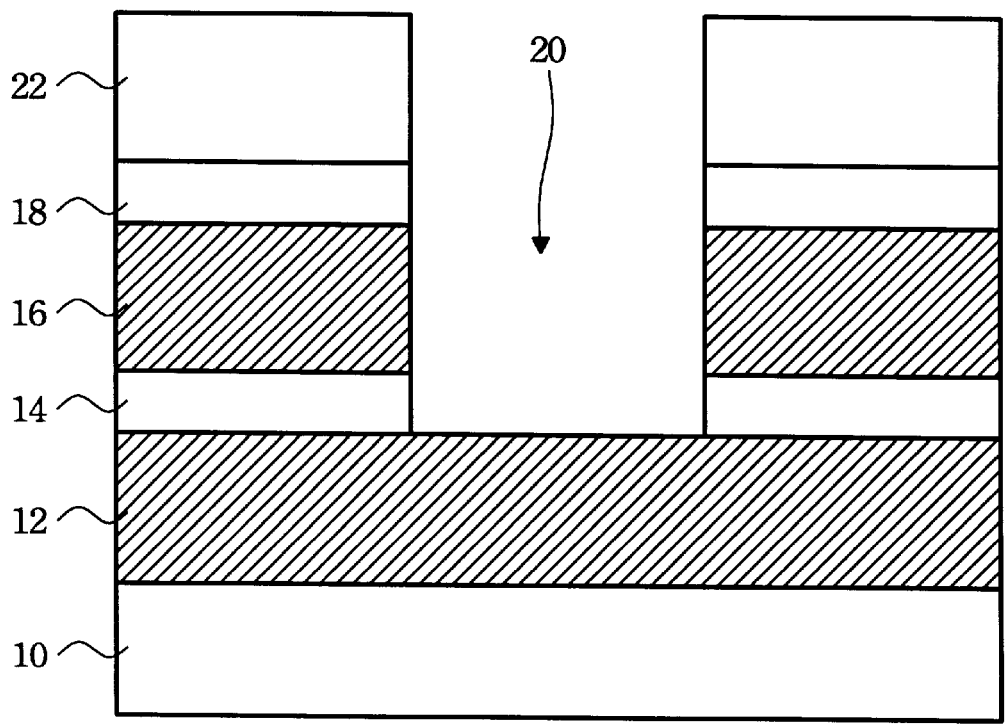
FIG. 2 illustrates a cross-sectional view of the step of defining a node opening in the first silicon layer, the second oxide layer, and the nitride layer upon the first oxide layer in accordance with the present invention.

Turning to FIG. 2, a node opening 20 is defined in the first silicon layer 18, the second oxide layer 16, and the nitride layer 14. The node opening 20 is defined right upon the first oxide layer 12 in the case. The node opening 20 can be formed with sequentially a lithography process and etching processes. A photoresist layer 22 can be utilized in the lithography process to define a region of forming the node opening 20, as indicated in the figure. As a preferred embodiment, a region of forming the node opening 20 can be defined in a circular shape and thus the node opening 20 is defined as a cylindrical-shaped opening. The unmasked regions of the first silicon layer 18, the second oxide layer 16, and the nitride layer 14 are then removed with preferably an anisotropic etching process. The process like reactive ion etching (RIE) process can be applied.

Figure 3:
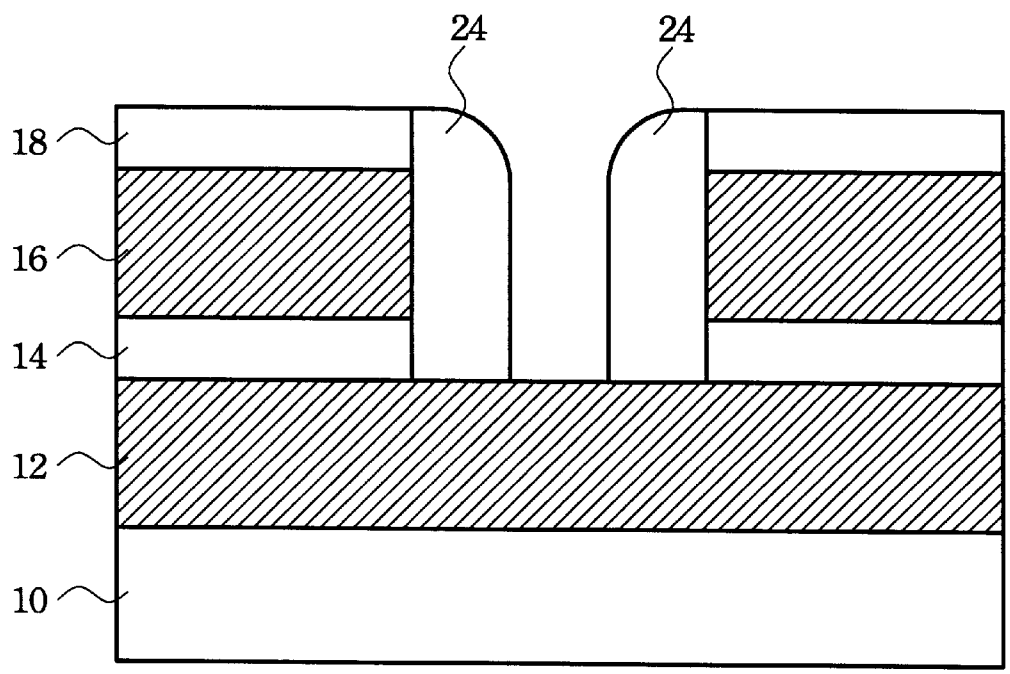
FIG. 3 illustrates a cross-sectional view of the step of forming sidewall structures on sidewalls of the node opening in accordance with the present invention.
Figure 4:
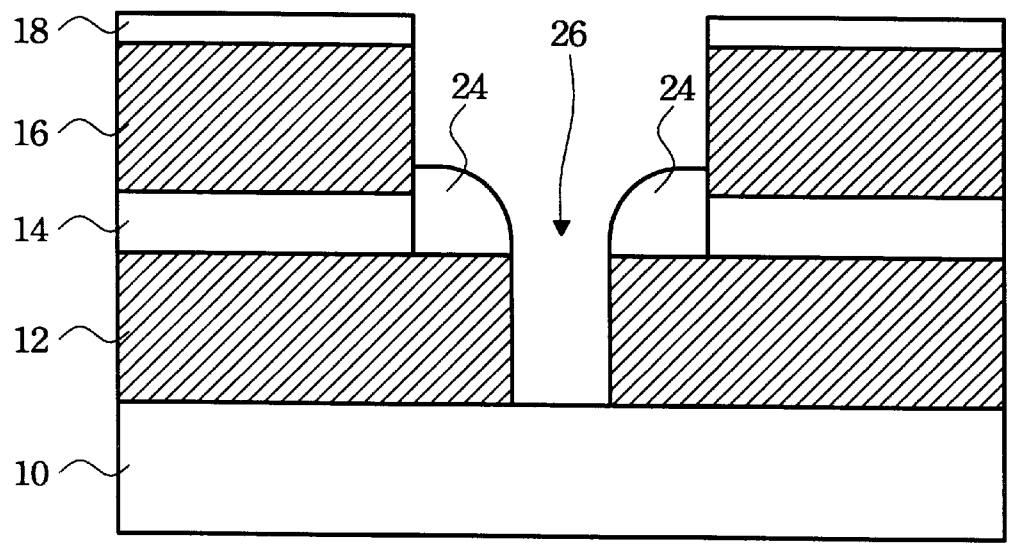
FIG. 4 illustrates a cross-sectional view of the step of defining a contact opening in the first oxide layer under the node opening in accordance with the present invention.

Next, sidewall structures 24 are then formed on sidewalls of the node opening 20, as shown in FIG. 3. In the case, nitride sidewall structures are formed as the sidewall structures 24. A nitride depositing and etching-back process can be performed to form nitride spacers. Turning to FIG. 4, a contact opening 26 is defined in the first oxide 12 under the node opening 20. The contact opening 26 is defined under a region uncovered by the sidewall structures 24. With the masking of the sidewall structures 24, a self-aligned patterning process preferably with a dry etching step can be exploited in defining the contact opening 26.

Figure 5:
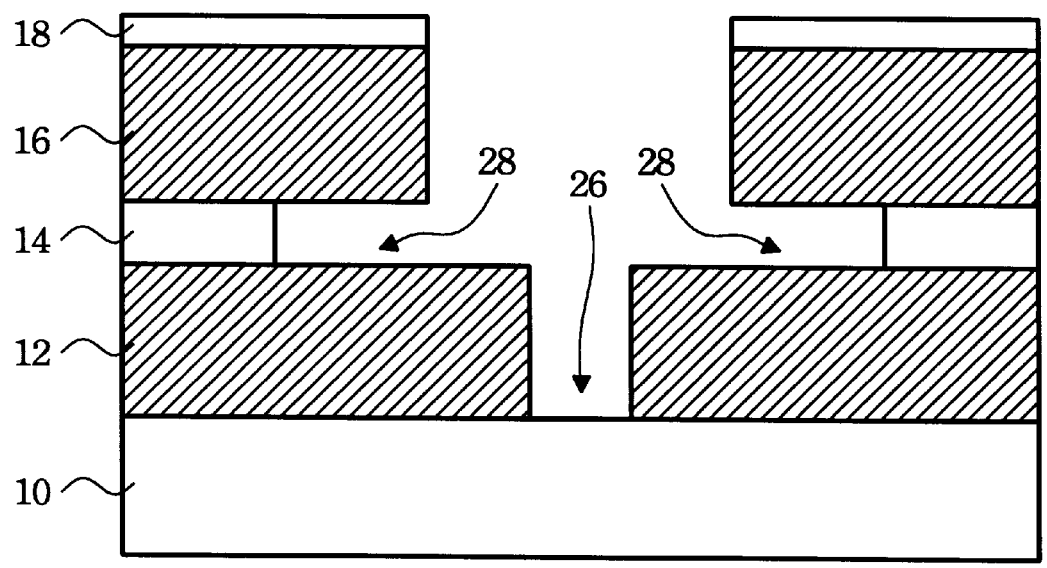
FIG. 5 illustrates a cross-sectional view of the step of removing the sidewall structures and a portion of the nitride layer nearby the node opening in accordance with the present invention.
Figure 6:
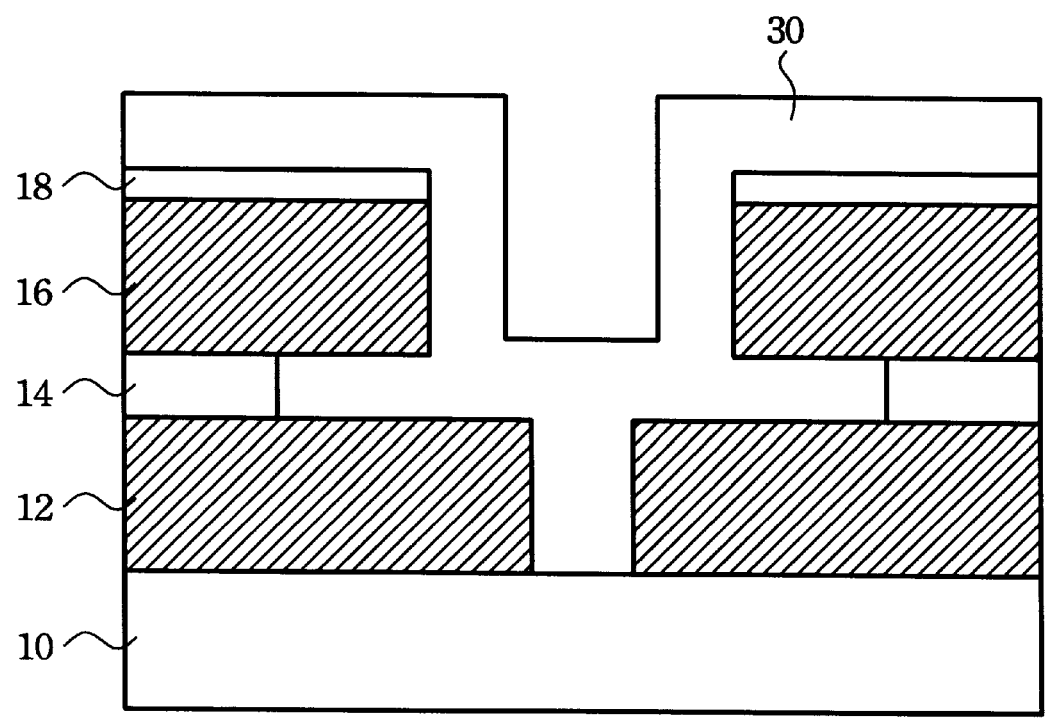
FIG. 6 illustrates a cross-sectional view of the step of forming a second silicon layer conformably over the contact opening, the undercut structures, the node opening, and the first silicon layer in accordance with the present invention.

Referring to FIG. 5, after the contact opening 26 is defined, the sidewall structures 24 and a portion of the nitride layer 14 are removed. The portion of the nitride layer 14 which located nearby the node opening are removed to form undercut structures 28 under the second oxide layer 16, as indicated in the figure. A wet etching step can be applied. With the nitride material of the sidewall structures 24 and the nitride layer 14, an etchant of hot phosphoric acid ($H_3PO_4$) can be used. Turning to FIG. 6, a second silicon layer 30 is formed conformably over the contact opening 20, the undercut structures 28, the node opening 26, and the first silicon layer 18. Being employed as an electrode of the storage cell, the second silicon layer 30 can be a doped polysilicon layer. The doped polysilicon layer can be formed with a deposition process. A in-situ doping process can be utilized to dope n-type or p-type dopants. In the case, n-type dopants are doped for providing a low resistance.

Figure 7:
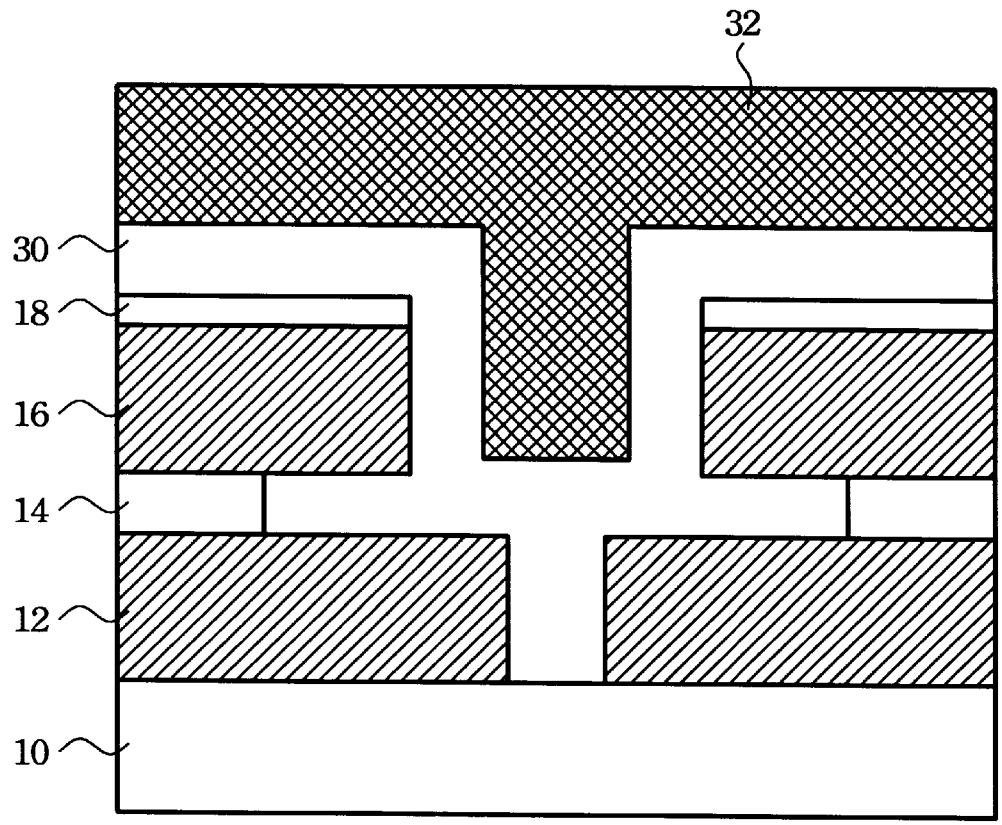
FIG. 7 illustrates a cross-sectional view of the step of forming a filling layer over the second silicon layer in accordance with the present invention.
Figure 8:
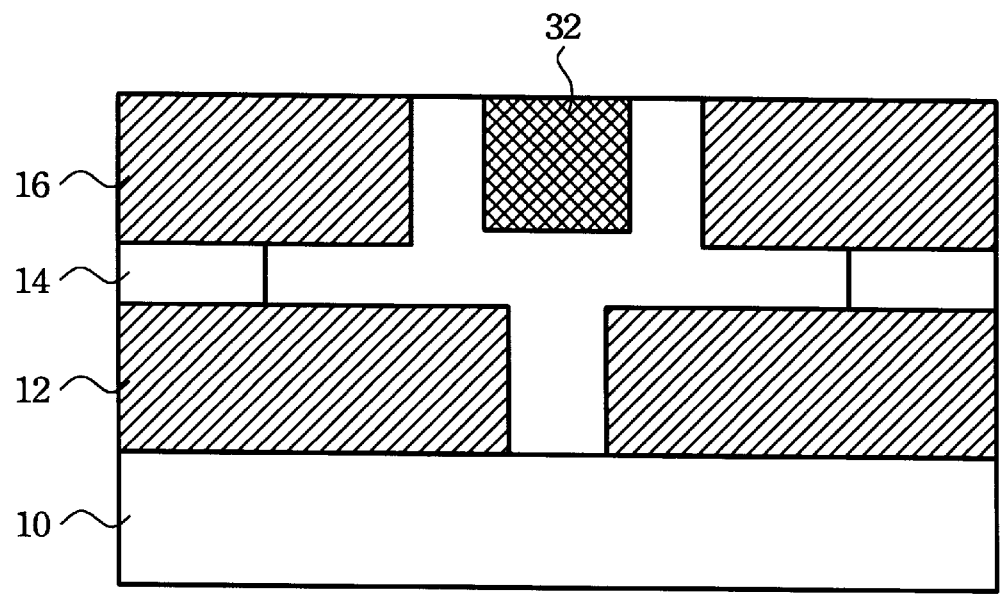
FIG. 8 illustrates a cross-sectional view of the step of planarizing the substrate down to a surface of the second oxide layer in accordance with the present invention.

Next, a filling layer 32 is formed over the second silicon layer 30, as shown in FIG. 7. The filling layer 32 is employed for filling recessed regions to provide an improved topography of the filled top surface. A spin-on-glass (SOG) layer can be utilized to planarize the device surface. Referring to FIG. 8, a planarizing step or an etching-back step is performed on the substrate 10 to planarize the top surface down to the surface of the second oxide layer 16. In the case, a chemical-mechanical polishing (CMP) process can be applied to provide a planar top surface with uniform height over the substrate 10.

Figure 9:
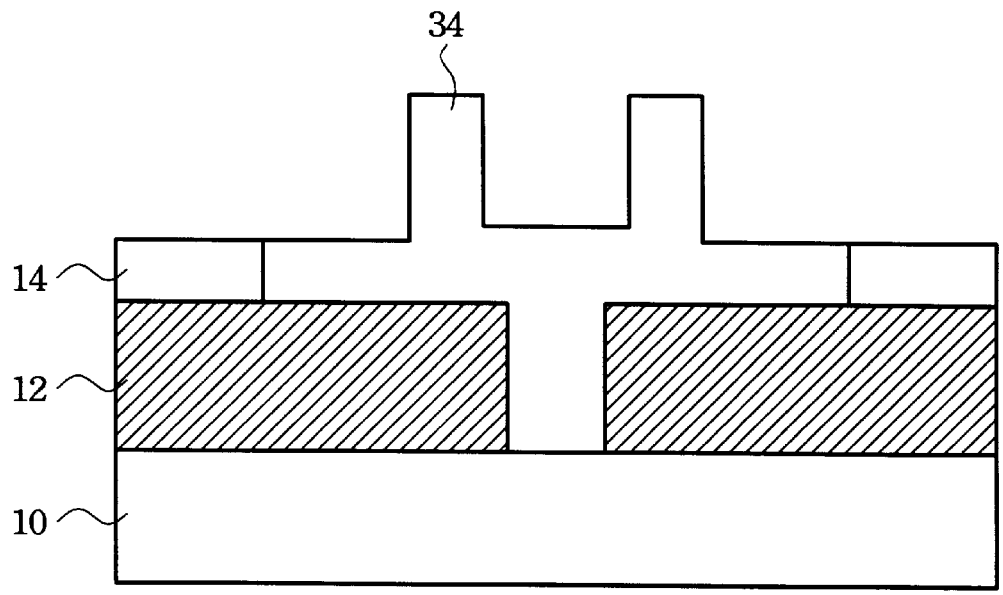
FIG. 9 illustrates a cross-sectional view of the step of removing the filling layer and the second oxide layer in accordance with the present invention.
Figure 10:
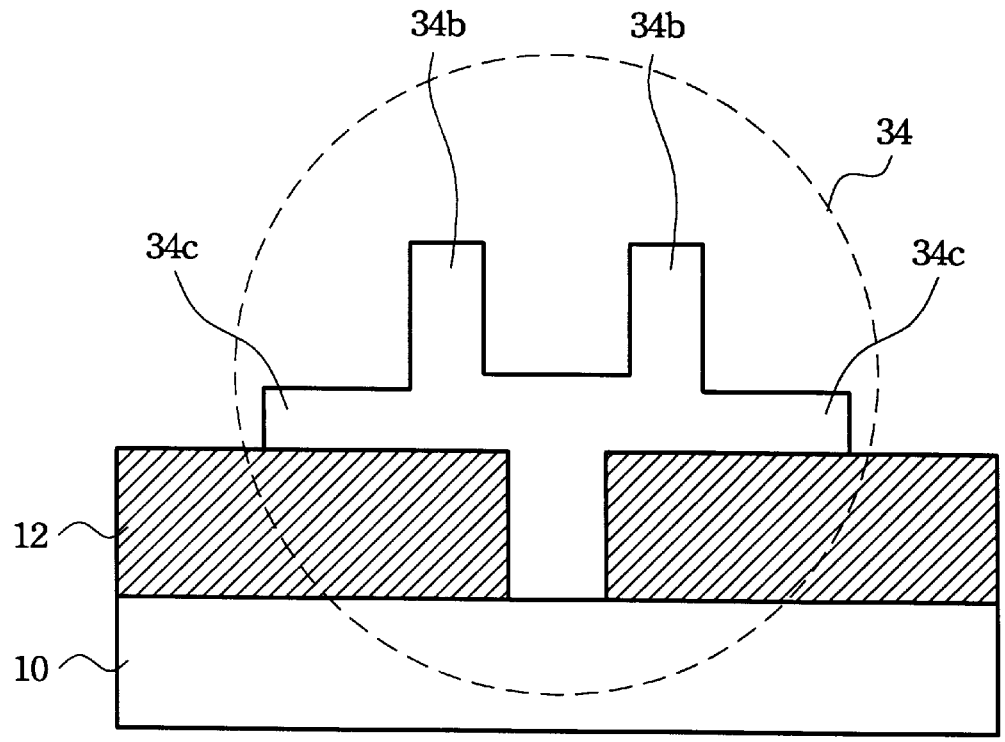
FIG. 10 illustrates a cross-sectional view of the step of removing the nitride layer in accordance with the present invention.

Turning to FIG. 9, the filling layer 32 and the second oxide layer 16 are then removed. The filling layer 32 and the second oxide layer 16 can be removed with a hydrofluoric acid (HF) in a wet etching process. The wet etching is performed using the nitride layer 14 and the second silicon layer 30 as stop layers for masking the underlying structures. The nitride layer 14 is then removed, as shown in FIG. 10 preferably with a wet etching process by a hot phosphoric acid ($H_3PO_4$) solution. Therefore, the bottom electrode 34 of a storage cell is formed. The bottom electrode 34 in the present invention is composed of the second silicon layer 30 deposited in a single step. In most prior art processes used in defining the electrode, several deposition and patterning processes are performed to form a three-dimensional node with connection interfaces. Therefore, a better strength of the bottom electrode 34 can be provided in the invention compared with conventional structures with low-strength interfaces. Besides, the vertical portion 34b of the electrode can be well-supported with the lateral extended edge 34c, as indicated in the figure.

Figure 11:
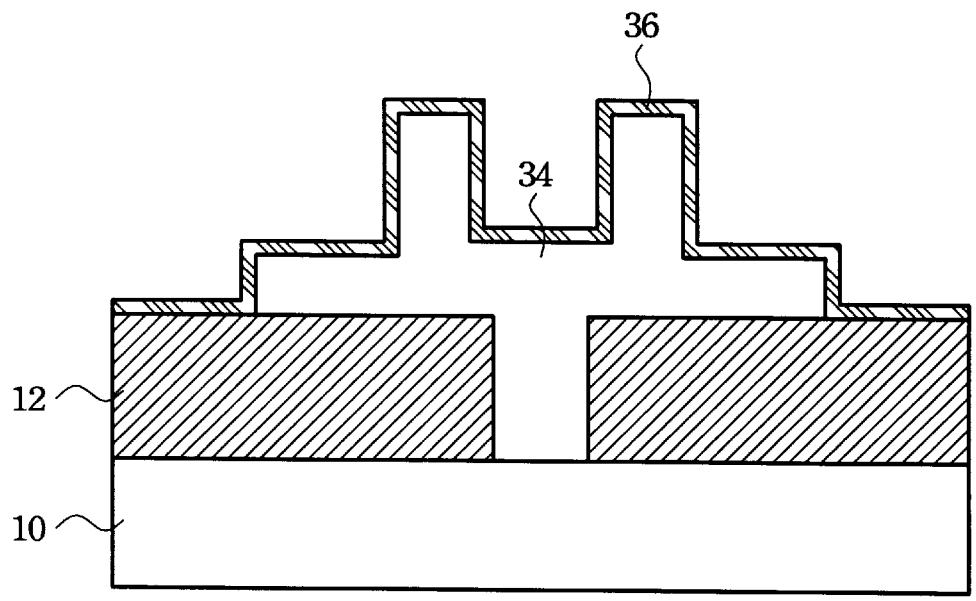
FIG. 11 illustrates a cross-sectional view of the step of forming a dielectric film conformably over the second silicon layer in accordance with the present invention.
Figure 12:
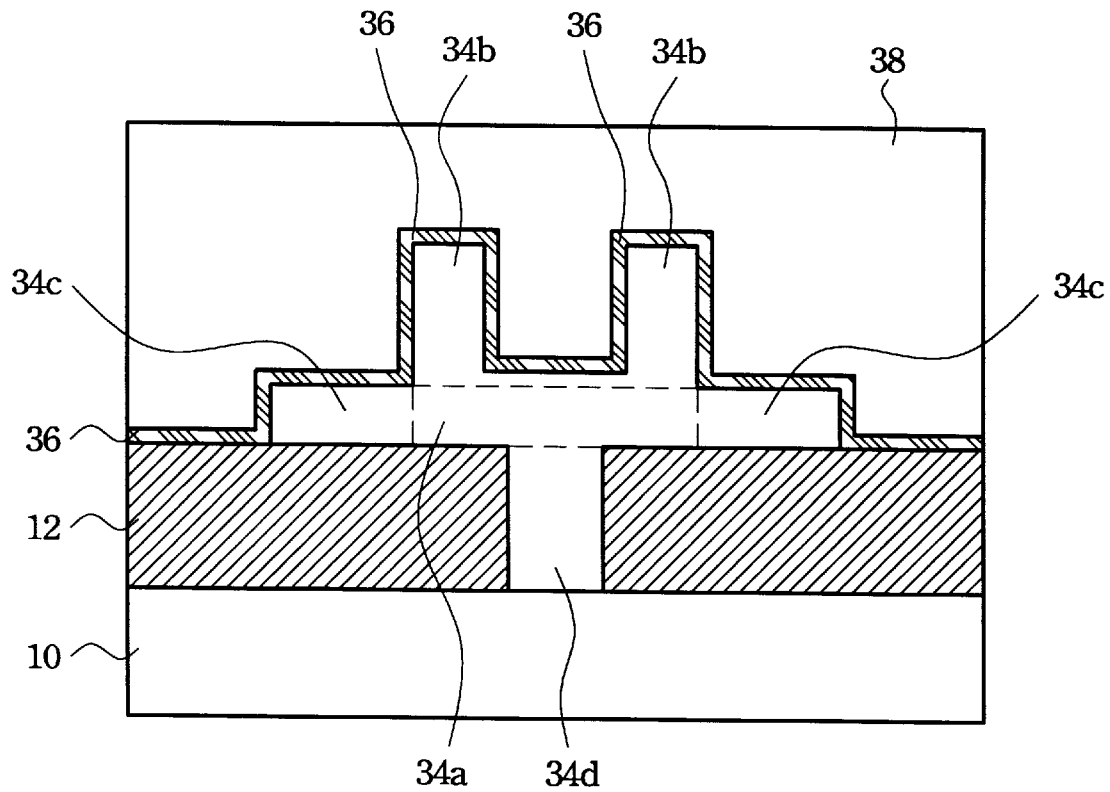
FIG. 12 illustrates a cross-sectional view of the step of forming a conductive layer over the dielectric layer in accordance with the present invention.

Referring to FIG. 11, a dielectric film 36 is formed conformably over the second silicon layer 30, namely the bottom electrode 34. The dielectric materials like a nitride-oxide (N—O) layer, an oxide-nitride-oxide (O—N—O) layer, PZT, BST, and $Ta_2O_5$ can be employed. Finally, a conductive layer 38 is formed over the dielectric layer 36, as shown in FIG. 12, to serve as a top electrode of the storage cell. In the case, the conductive layers like silicon or metal layers can be deposited or sputtered to form the top electrode.

Therefore, a self-aligned crown-shaped capacitor is formed with the above-described method. The storage capacitance can be significantly increased compared with the prior art structures. The crack issue of sidewall polysilicon in the conventional processes can be eliminated with reduced number of masks in the self-aligned process.

As is understood by a person skilled in the art, the foregoing descriptions of the preferred embodiment of the present invention are an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of forming a capacitor on a semiconductor substrate, said method comprising the steps of:

forming a first oxide layer over said substrate;

forming a nitride layer over said first oxide layer;

forming a second oxide layer over said nitride layer;

forming a first silicon layer over said second oxide layer;

defining a node opening in said first silicon layer, said second oxide layer, and said nitride layer upon said first oxide layer;

forming sidewall structures on sidewalls of said node opening;

defining a contact opening in said first oxide layer under said node opening, said contact opening being defined under a region uncovered by said sidewall structures;

removing said sidewall structures and a portion of said nitride layer nearby said node opening to form undercut structures under said second oxide layer;

forming a second silicon layer conformably over said contact opening, said undercut structures, said node opening, and said first silicon layer;

forming a filling layer over said second silicon layer;

planarizing said substrate down to a surface of said second oxide layer;

removing said filling layer and said second oxide layer;

removing said nitride layer;

forming a dielectric film conformably over said second silicon layer; and forming a conductive layer over said dielectric layer.

2. The method of claim 1, wherein said first oxide layer and said second oxide layer are formed by chemical vapor deposition processes.

3. The method of claim 1, wherein said first silicon layer comprises a polysilicon layer.

4. The method of claim 1, wherein said node opening is a cylindrical opening.

5. The method of claim 1, wherein said sidewall structures comprise nitride spacers.

6. The method of claim 1, wherein the step of removing said sidewall structures and said portion of said nitride layer is performed by a wet etching process.

7. The method of claim 1, wherein said second silicon layer comprises a doped polysilicon layer.

8. The method of claim 1, wherein said filling layer comprises a spin-on-glass layer.

9. The method of claim 1, wherein the step of planarizing said substrate is performed with a chemical-mechanical polishing process.

10. The method of claim 1, wherein said dielectric film is selected from the group consisting of a nitride-oxide layer, an oxide-nitride-oxide layer, PZT, BST, and $Ta_2O_5$.

11. The method of claim 1, wherein said conductive layer is selected from the group consisting of a doped silicon and metal layers.

12. A method of forming a storage cell on a semiconductor substrate, said method comprising the steps of:

forming a first oxide layer over said substrate;

forming a nitride layer over said first oxide layer;

forming a second oxide layer over said nitride layer;

forming a first silicon layer over said second oxide layer;

defining a node opening in said first silicon layer, said second oxide layer, and said nitride layer upon said first oxide layer;

forming sidewall structures on sidewalls of said node opening;

defining a contact opening in said first oxide layer under said node opening, said contact opening being defined under a region uncovered by said sidewall structures;

removing said sidewall structures and a portion of said nitride layer nearby said node opening with a wet etching process to form undercut structures under said second oxide layer;

forming a second silicon layer conformably over said contact opening, said undercut structures, said node opening, and said first silicon layer;

forming a filling layer over said second silicon layer, said filling layer comprising a spin-on-glass layer;

planarizing said substrate down to a surface of said second oxide layer;

removing said filling layer and said second oxide layer;

removing said nitride layer; and forming a dielectric film conformably over said second silicon layer; and forming a conductive layer over said dielectric layer.

13. The method of claim 12, wherein said first oxide layer and said second oxide layer are formed by chemical vapor deposition processes.

14. The method of claim 12, wherein said first silicon layer comprises a polysilicon layer.

15. The method of claim 12, wherein said sidewall structures comprise nitride spacers.

16. The method of claim 12, wherein said second silicon layer comprises a doped polysilicon layer.

17. The method of claim 12, wherein the step of planarizing said substrate is performed with a chemical-mechanical polishing process.

18. The method of claim 12, wherein said dielectric film is selected from the group consisting of a nitride-oxide layer, an oxide-nitride-oxide layer, PZT, BST, and $Ta_2O_5$.

19. The method of claim 12, wherein said conductive layer is selected from the group consisting of a doped silicon layer and metal layers.

20. The method of claim 12, wherein said node opening is a cylindrical opening.

* * * * *